(12) United States Patent
Partridge et al.

(10) Patent No.: US 7,595,539 B2
(45) Date of Patent: Sep. 29, 2009

(54) METHOD FOR RELEASE OF SURFACE MICROMACHINED STRUCTURES IN AN EPITAXIAL REACTOR

(75) Inventors: Aaron Partridge, Palo Alto, CA (US); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 620 days.

(21) Appl. No.: 11/155,035

(22) Filed: Jun. 16, 2005

(65) Prior Publication Data
US 2007/0178703 A1 Aug. 2, 2007

Related U.S. Application Data

(62) Division of application No. 10/334,186, filed on Dec. 30, 2002, now Pat. No. 6,939,809.

(51) Int. Cl.
*H01L 21/00* (2006.01)
*C23F 1/00* (2006.01)
*G01P 3/00* (2006.01)

(52) U.S. Cl. .............. 257/415; 257/E21.102; 257/E32.005; 216/2; 73/504

(58) Field of Classification Search .......... 257/E33.005, 257/E21.102; 216/2; 73/504
See application file for complete search history.

(56) References Cited

U.S. PATENT DOCUMENTS

| | | | |
|---|---|---|---|
| 5,683,591 A | 11/1997 | Offenberg | |
| 5,804,083 A | 9/1998 | Ishii et al. | |
| 5,922,212 A | 7/1999 | Kano et al. | |
| 6,238,580 B1 | 5/2001 | Cole et al. | |
| 6,287,885 B1 | 9/2001 | Muto et al. | |
| 6,318,175 B1 | 11/2001 | Muchow et al. | |
| 6,423,563 B2 | 7/2002 | Fukada et al. | |
| 6,464,892 B2 | 10/2002 | Moon et al. | |

(Continued)

FOREIGN PATENT DOCUMENTS

DE 100 06 035 8/2001

(Continued)

OTHER PUBLICATIONS

European Patent Office, Application No. EP 03 02 3818, International Search Report dated Sep. 15, 2004.

*Primary Examiner*—Howard Weiss
*Assistant Examiner*—Steven H Rao
(74) *Attorney, Agent, or Firm*—Kenyon & Kenyon LLP

(57) ABSTRACT

A method for releasing from underlying substrate material micromachined structures or devices without application of chemically aggressive substances or excessive forces. The method starts with the step of providing a partially formed device, comprising a substrate layer, a sacrificial layer deposited on the substrate, and a function layer deposited on the sacrificial layer and possibly exposed portions of the substrate layer and then etched to define micromechanical structures or devices therein. The etching process exposes the sacrificial layer underlying the removed function layer material. Next there are the steps of cleaning residues from the surface of the device, and then directing high-temperature hydrogen gas over the exposed surfaces of the sacrificial layer to convert the silicon dioxide to a gas, which is carried away from the device by the hydrogen gas. The release process is complete when all of the silicon dioxide sacrificial layer material underlying the micromachined structures or devices is removed.

7 Claims, 5 Drawing Sheets

U.S. PATENT DOCUMENTS

| | | |
|---|---|---|
| 6,650,455 B2 | 11/2003 | Miles |
| 6,670,281 B2 | 12/2003 | Luly et al. |
| 6,679,995 B1 | 1/2004 | Banjac et al. |
| 6,698,295 B1 | 3/2004 | Sherrer |
| 2002/0073779 A1 | 6/2002 | Takeshi |
| 2003/0049878 A1 | 3/2003 | Offenberg |
| 2003/0073293 A1 | 4/2003 | Ferro et al. |

FOREIGN PATENT DOCUMENTS

| | | |
|---|---|---|
| DE | 100 17 976 | 10/2001 |
| DE | 19704454 | 8/2002 |
| EP | 0 376 252 | 10/1997 |
| EP | 1 235 258 | 8/2002 |
| EP | 1 435 335 | 7/2004 |

METHOD FOR RELEASE OF SURFACE MICROMACHINED STRUCTURES IN AN EPITAXIAL REACTOR

CROSS-REFERENCE TO RELATED APPLICATION

This application is a division of prior application U.S. Ser. No. 10/334,186 filed Dec. 30, 2002 now U.S. Pat. No. 6,939,809.

FIELD OF THE INVENTION

The present invention relates to the manufacturing of micromechanical devices, and relates in particular to a method for releasing micromechanical structures from adjacent structures during manufacture in an epitaxial reactor.

BACKGROUND INFORMATION

One method of depositing structural layers during manufacture of surface-micromachined devices involves the use of an epitaxial reactor. Epitaxy is a process for producing layers of monocrystalline layers of silicon over a single crystal substrate, and for forming polycrystalline silicon layers over other substrate materials, such as $SiO_2$ films on silicon substrates. Epitaxial reactors may be operated with precisely controlled temperature and atmosphere environmental conditions to ensure uniform deposition and chemical composition of the layer(s) being deposited on the target substrate. In addition to precise control, use of an epitaxial reactor can permit build-up of layers on a substrate at significantly higher rates than typically found with LPCVD systems.

From U.S. Pat. No. 6,318,175, for example, one approach to creating a micromachined device such as a rotation sensor is to apply a sacrificial $SiO_2$ layer to a monocrystalline silicon substrate at a position where one or more micromechanical deflection parts are to be formed. Windows through the $SiO_2$ layer to the silicon substrate may then be formed by applying a layer of photosensitive material, overlaying a mask pattern over the photosensitive layer and exposing the masked surface to light, and then using a developer to selectively remove the light-exposed portion of the photosensitive material and HF to etch the $SiO_2$ layer directly underlying these exposed portions. Following creation of the desired windows in the $SiO_2$ layer, an upper epitaxial layer of silicon may then be deposited on both the $SiO_2$ layer and the contact openings. The upper epitaxial layer grows in polycrystalline form on the $SiO_2$ layer, and in monocrystalline form on the contact window openings to provide a direct connection to the silicon substrate. The structural elements of the micromechanical device may be defined on the upper silicon layer using, for example, an anisotropic plasma etching technique. The etching may be performed through the polycrystalline portion of the epitaxial layer to the $SiO_2$ layer to form trenches around the structural limitations of the micromechanical parts. Finally, the $SiO_2$ layer may be removed from beneath the micromechanical parts in the upper silicon layer during an etching process to complete the formation of the micromechanical device.

The final step of releasing the micromachined structures formed in the upper silicon layer from the underlying sacrificial silicon dioxide layer may be problematic given the following: the geometry of the micromachined structures; the difficulty in ensuring complete etchant penetration through the sacrificial layer beneath the structures; and problems with device deformation and adhesion during the dry process. Release has been accomplished by etching using an HF vapor, as discussed in German Published Patent Application No. 19704454 and U.S. Pat. No. 5,683,591, or by application of liquid HF in combination with supercritical carbon dioxide ($CO_2$), to selectively release and evacuate the sacrificial $SiO_2$ from underneath the micromachined structural parts.

These processes, however, may have associated disadvantages. The chemically aggressive nature of HF may preclude its use in releasing micromachined devices created on substrates cohabited by integrated circuit portions. There may be potential damage due to liquid etchants impinging on delicate micromachined structures. There may be problems created by incomplete elimination of liquid etchants. There may be increased process complexity and expense associated with process steps requiring removal and/or reinsertion of the devices from the epitaxial reactor. There may be a need to maintain the supply and environmental control of materials in special states in an epitaxial reactor environment.

Therefore there is a need for a less-complex, more cost-effective method for releasing micromachined structures from their underlying substrates.

SUMMARY OF THE INVENTION

According to an exemplary embodiment of the present invention, a method for releasing a micromachined structure or device from its supporting substrate may begin with a partially formed micromachine device, which may comprise a substrate layer of, for example, monocrystalline silicon, a sacrificial oxide-bearing layer of, for example, deposited or grown $SiO_2$ on the substrate layer and etched to create a pattern of holes or open areas through to the substrate layer, and a functional layer of, for example, epitaxially deposited silicon which may be etched to define micromechanical structures or devices thereon and thereby expose the underlying sacrificial layer.

Once the elements of the micromechanical structure or device have been defined in the function layer, an exemplary embodiment of the present invention provides for in situ cleaning of the device within the epitaxial reactor with both hydrogen ($H_2$) to remove surface oxides, and with hydrochloric acid (HCl) to remove silicon residues and surface imperfections resulting from the trench etching process. Following the cleaning step, the structures may be released by exposure of the device to high temperature $H_2$, which bonds to the sacrificial layer's oxide-bearing material. The resulting gas may be flushed from the device by the $H_2$ flow. Exposure to the $H_2$ flow may be continued until all the sacrificial layer material beneath the elements of the micromechanical structure or device is evacuated.

The release of the micromechanical elements from their underlying sacrificial layer supports in the foregoing manner may provide the following advantages: avoiding the need to apply high forces on delicate elements; preventing adhering of the micromechanical element release from the sacrificial layer (i.e., "sticking"); and reducing the need for highly aggressive etching agents such as HF or liquid release agents whose complete removal from the micromechanical structure or device may be problematic. The use of $H_2$ in this manner may have the further advantage of ready compatibility with an epitaxial environment and relatively convenient handling of materials as compared to other release substances such as acids, thereby simplifying process operations and enhancing epitaxial reactor production of the micromachined devices.

DETAILED DESCRIPTION

Figure 1A:
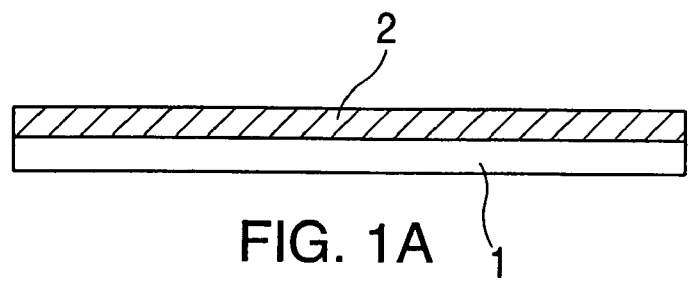
FIGS. 1a through 1f show cross-sections and plan views of various stages of production of an exemplary micromachined device.
Figure 1B:
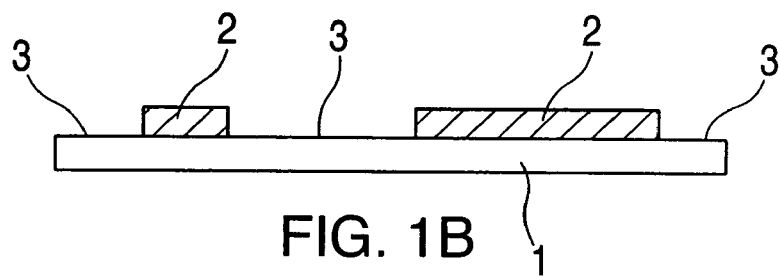
Figure 1C:
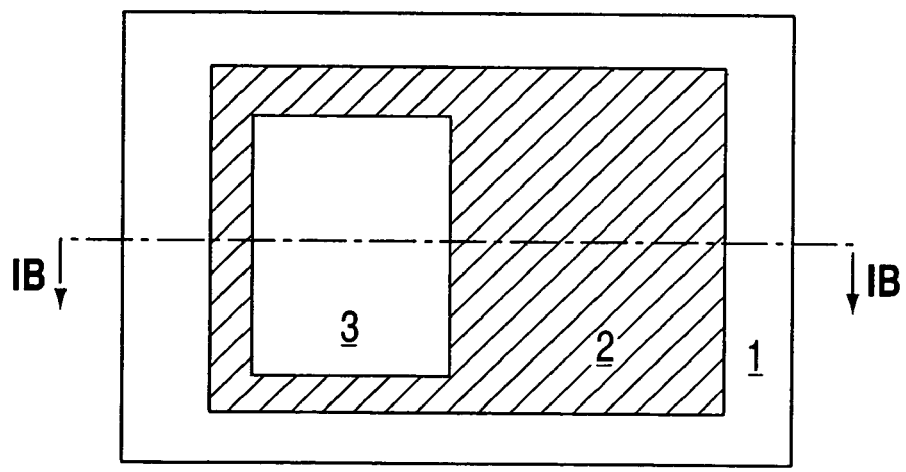

According to an exemplary embodiment of the present invention, a method for releasing a micromachined structure or device from its supporting substrate begins with a partially formed device, which may be formed as follows. As shown in the cross-section view in FIG. 1a, the partially formed device is based on a substrate layer 1 of silicon, upon which a sacrificial layer 2 of $SiO_2$ is deposited or grown. FIG. 1b shows a cross-section view of the substrate and sacrificial layer combination of FIG. 1a after a pattern of holes or open areas 3 have been formed in sacrificial layer 2 using etching techniques, such as application of a photo-sensitive material over the sacrificial layer, applying a mask with the desired etching pattern over the photo-sensitive material, exposing the masked surface to light, and then applying an etchant to remove the exposed portions of the photo-sensitive material and the sacrificial $SiO_2$ underneath the exposed portions. FIG. 1c shows a plan view of the partially formed device of FIG. 1b showing hole 3 defined by the etching process through sacrificial layer 2. The cross-section view in FIG. 1b is taken through the line IB-IB of FIG. 1c.

Figure 1D:
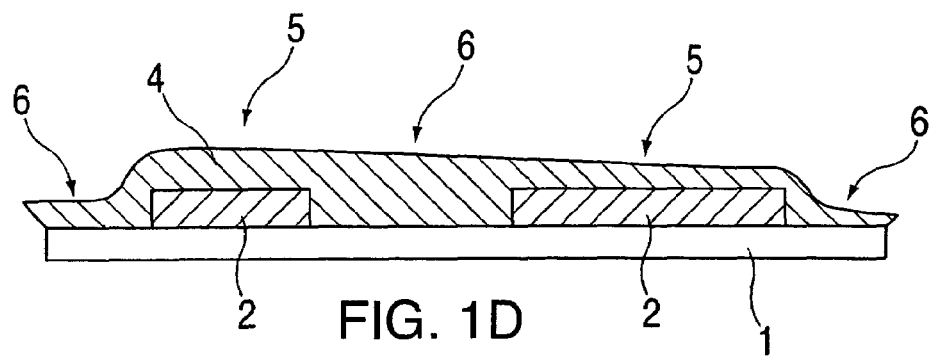
Figure 1E:
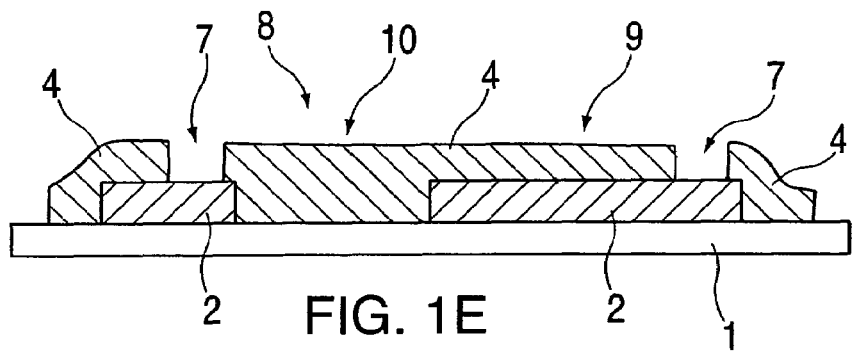
Figure 1F:
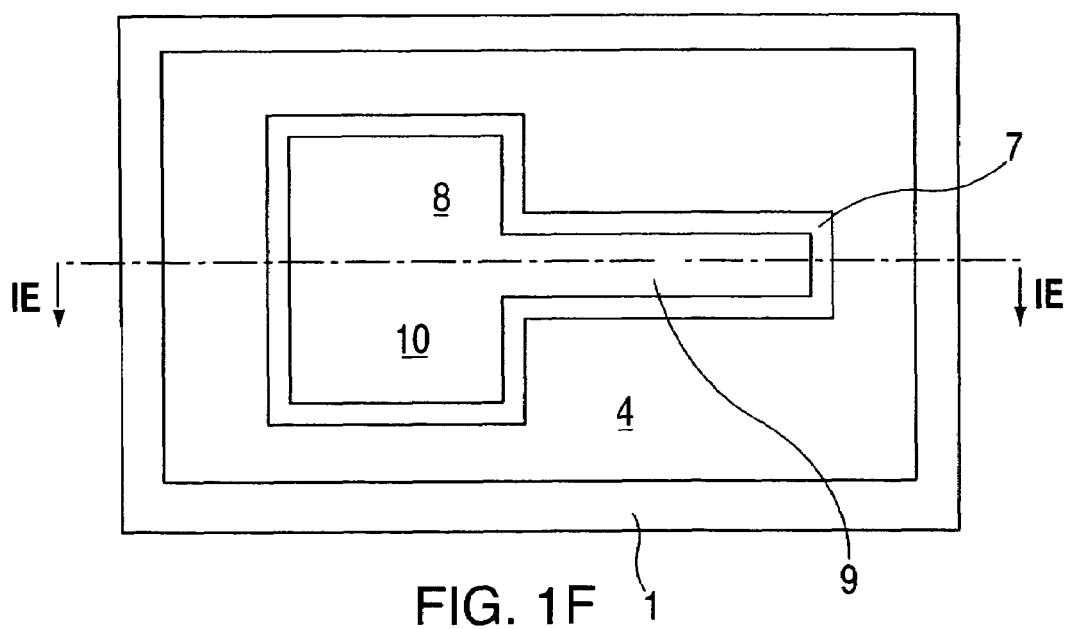

The partially formed device may then receive an epitaxially deposited function layer 4 of silicon, as shown in cross-section view 1d. The portions 5 of the function layer 4 formed on the $SiO_2$ have a polycrystalline structure, while the portions 6 of the function layer 4 formed on the monocrystalline silicon substrate layer 1 have a monocrystalline structure. Function layer 4 is then etched to define the micromechanical structures or devices in function layer 4, with deep, narrow trenches 7 etched through the exposed portions of the photo-sensitive material and the underlying polycrystalline silicon of function layer 4, as shown in FIG. 1e. FIG. 1f is a plan view of the partially formed device showing micromechanical element 8 defined by etched trenches 7. The cross-section views in FIG. 1d and FIG. 1e are both taken through the line IE-IE, which corresponds to line IB-IB of FIG. 1c. The deflection beam portion 9 of micromechanical element 8 is shown in FIG. 1e extending from the base portion 10 of micromechanical element 8. Base portion 10 is affixed to the silicon substrate 1, while deflection beam portion 9 may rest upon, and may therefore be restrained by, an underlying column 11 of $SiO_2$ of sacrificial layer 2. This column of sacrificial material must be removed to free beam 9 to deflect from its rest position during operation of the micromechanical device.

Next, the surfaces of the partially formed device may be cleaned in situ in the epitaxial reactor. In order to remove oxides on the surface of the device, $H_2$ at elevated temperature may be passed over the device, which may cause the oxide molecules to bond to the $H_2$ to form water and evaporate from the device surface. Following removal of any residual surface oxides, gaseous HCl may be used to remove any remaining silicon residues and surface imperfections from the surface of the device, such as silicon residues remaining on the device surface during the micromechanical element-defining trench etching process.

Figure 2A:
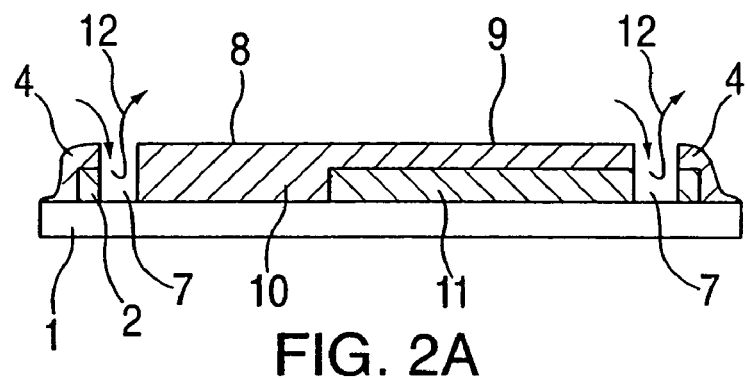
FIGS. 2a through 2c illustrate the removal of sacrificial material to release a micromechanical element in accordance with an exemplary embodiment of the present invention.
Figure 2B:
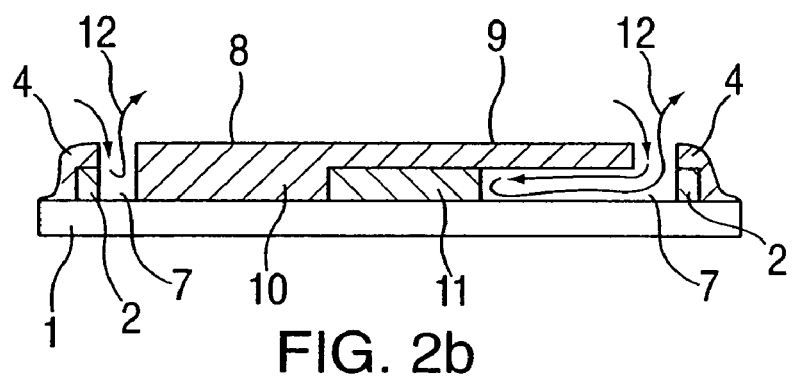
Figure 2C:
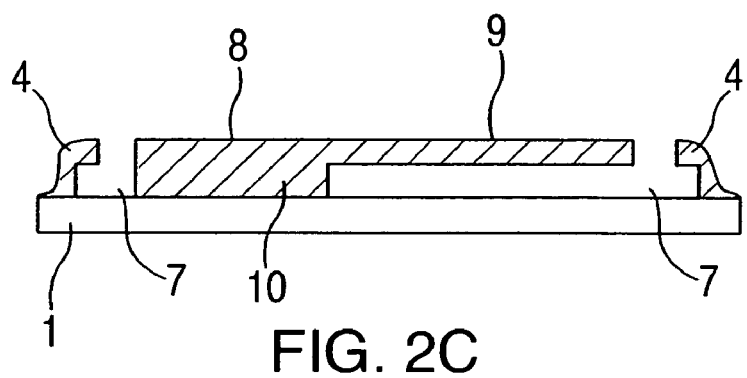

Following the cleaning operation(s), the device may be exposed to $H_2$ flowing at temperatures in the range of 800° C. to 1,400° C., as shown in FIG. 2a. FIG. 2a illustrates the exposure of the $SiO_2$ of the sacrificial layer in communication with the trenches 7 defining micromechanical element 8 to the high temperature $H_2$ gas 12 flowing into and out of the trenches 7. Upon reaching the exposed surfaces of the $SiO_2$ sacrificial layer around and underneath the micromechanical element, the gaseous $H_2$ may bond to oxygen in the oxide-bearing material at the surface of the sacrificial layer, forming water ($H_2O$) and silicon monoxide (SiO). The water and silicon monoxide are gaseous, and accordingly may be immediately released from the exposed surface of the sacrificial layer into the flowing $H_2$ gas, which may sweep the water and silicon monoxide out of the device. As illustrated in FIG. 2b, the release and removal of the gaseous water and gaseous silicon monoxide from the device trenches 7 may expose additional $SiO_2$ in the sacrificial layer to the high temperature $H_2$ flow, causing additional $SiO_2$ to be released from the sacrificial layer. As illustrated in FIG. 2c, this process may continue until all the $SiO_2$ underlying the deflection beam portion 9 of micromechanical element 8 has been removed, and the beam is freed.

The foregoing method may have the following advantages: permitting removal of the sacrificial layer underlying the micromechanical elements without applying any significant impact force to the micromachined elements; ensuring complete removal of the sacrificial layer material under the micromechanical elements from the device. This method may avoid problems associated with incomplete drying of liquid agents from within the semi-conductor device following sacrificial layer removal.

In another alternative exemplary embodiment, an SOI (Silicon on Insulator) wafer may be used to construct the device, where the substrate layer, the sacrificial layer, and the function layer may collectively form the SOI wafer.

Increased production rates may result from higher etch rates and reduced handling of the wafer. Sacrificial layer removal rates may be further enhanced by, for example, increasing the temperature of the $H_2$ used to convert the $SiO_2$ to $H_2O$ and SiO, or by introduction of small amounts of gaseous germanium or gaseous silicon bearing compounds. Adding small amounts of silicon carrier during the $H_2$ exposure may also be useful to moderate the extent of silicon pitting at higher $H_2$ gas temperatures. The use of $H_2$ for $SiO_2$ removal in this exemplary embodiment may have the advantages of ready compatibility with existing epitaxial equipment and high temperature environments, and relatively convenient handling of materials. Accordingly, the method of the present embodiment may allow for simplified process operations, further enhancing epitaxial reactor production of micromachined devices.

Figure 3:
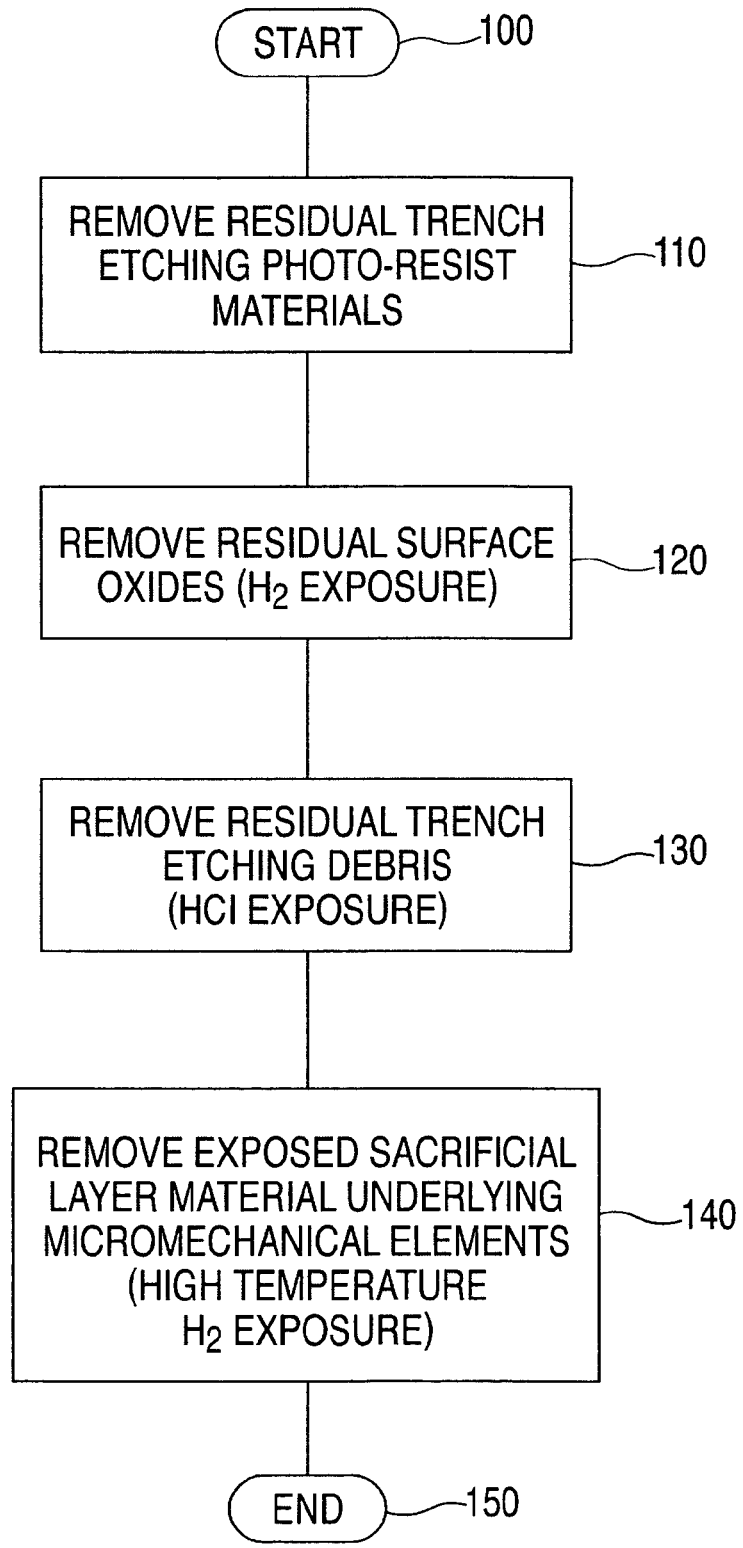
FIG. 3 is a flowchart illustrating steps for releasing a micromechanical element in accordance with an exemplary embodiment of the present invention.

FIG. 3 is a flowchart showing a detailed implementation of the foregoing steps for releasing a micromechanical element. The process method starts at step 100 with a device into which trenches have been etched to define an element of a micromechanical structure or device. In step 110, the surface is chemically cleaned. This step may include removing residual materials from the trench etching process, removing residual oxides from the surface of the micromechanical device remaining following the trenching process. Step 110 is followed by step 120, placing the substrate, wafer, and/or micromechanical device in an epitaxial reactor. Step 120 is followed by step 130, removing exposed sacrificial layer material by flowing $H_2$ gas at high temperatures within the device long enough to convert the sacrificial layer $SiO_2$ to gaseous $H_2O$ and $SiO$ and permit these to be removed from the sacrificial layer and be borne out of the device. The removing operation may be performed at a pressure between about 1 millitorr and 100 torr, and may preferably be performed at a pressure of about 10 torr. Step 140 follows step 130 and marks the end of the micromechanical element release portion of a micromachined device manufacturing process.

In an alternative exemplary embodiment, Step 110 may not be performed, and the process proceeds from Step 100 directly to Step 120. In another alternative exemplary embodiment, an in situ cleaning step may be performed between Step 120 and Step 130. The in situ cleaning step may be performed in the epitaxial reactor and may include removing residual oxides from the surface of the micromechanical device by exposing the surface of the device to $H_2$ gas and/or removing silicon residues by exposing the surface of the device to HCl. In a further exemplary embodiment, a step of epitaxial deposition may be performed following Step 130 before Step 140.

In another alternative exemplary embodiment, an SOI (Silicon on Insulator) wafer may be used in which a top silicon layer of the SOI wafer is the function layer and an insulator layer of the SOI wafer is the sacrificial layer.

Figure 4:
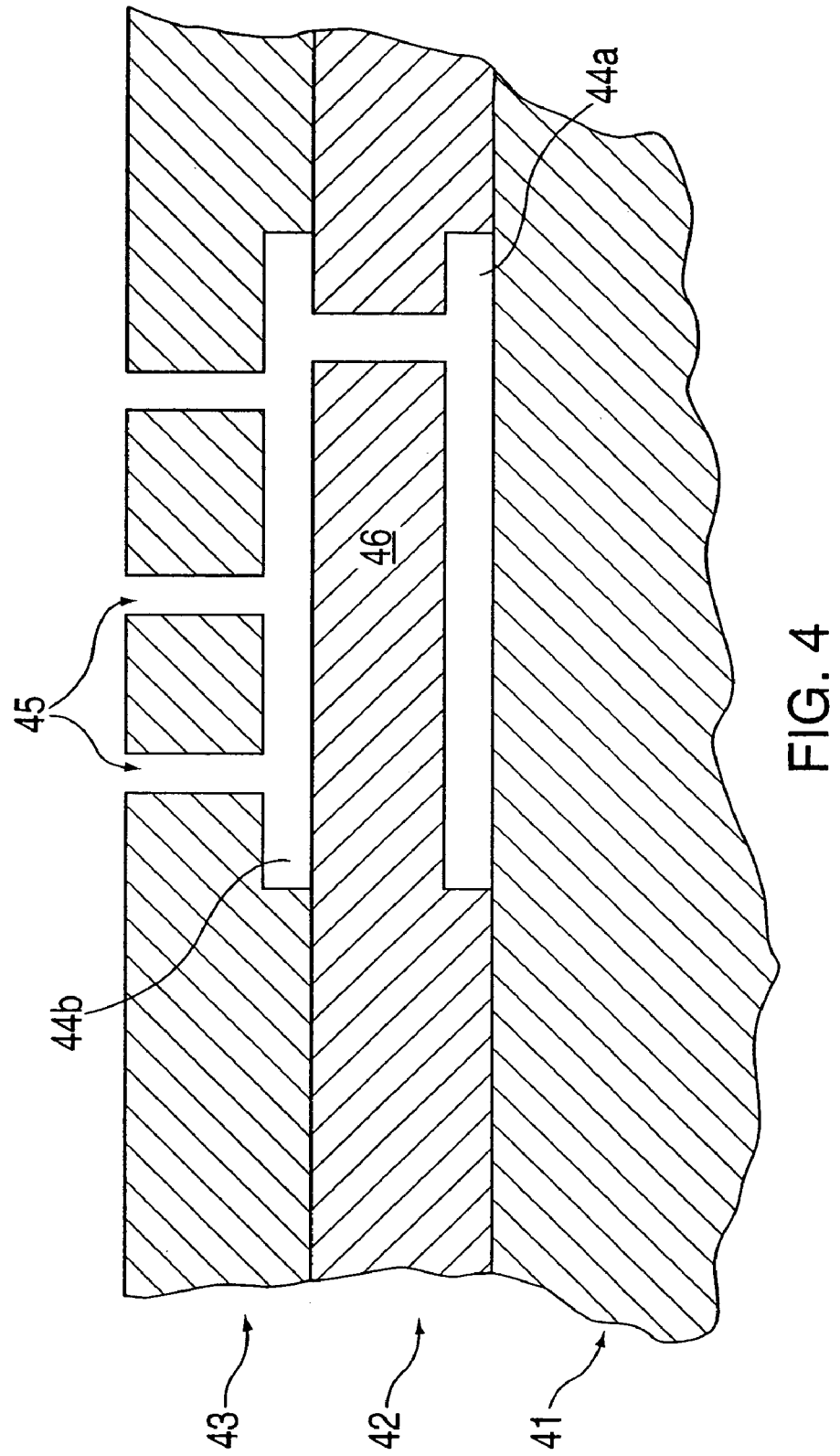
FIG. 4 shows a cross-section of an exemplary device having multiple layers of a silicon bearing compound.

FIG. 4 shows handle wafer 41, which may be a silicon wafer, with device layer 42 arranged above handle wafer 41 and defining cavity 44*a*. Cavity 44*a* may represent a space which was previously occupied by a sacrificial layer. Encapsulation layer 43 is arranged on top of device layer 42 and includes vents 45 which access another cavity 44*b*. In this manner, device 46 may be released from handle wafer 41 below, and from encapsulation layer 43 above, in one release step. In this manner, an exemplary device having multiple function layers and multiple sacrificial layers may be constructed. In an alternative exemplary embodiment, more sacrificial layers and more function layers may be arranged above encapsulation layer 43.

In other alternative exemplary embodiments, there may be more than one silicon layer to be released. For example, two vertically stacked silicon layers with sacrificial oxide layers under and between them. In these more complex structures, the sacrificial oxide may be on top of and beside, as well as on the bottom of, the structures.

While the present invention has been described in connection with the foregoing representative embodiment, it should be readily apparent to those of ordinary skill in the art that the representative embodiment is exemplary in nature and is not to be construed as limiting the scope of protection for the invention as set forth in the appended claims.

What is claimed is:

1. A device including micromechanical elements, comprising:
    a substrate layer;
    a sacrificial layer on at least a first portion of the substrate layer; and
    a function layer on at least a second portion of the sacrificial layer;
    wherein the function layer is released from the substrate layer by exposing the device to gaseous hydrogen.

2. The device as recited in claim 1, wherein the device is produced in an epitaxy reactor environment.

3. The device as recited in claim 1, wherein the function layer is released from the substrate layer by removing a third portion of the sacrificial layer, the third portion arranged between the function layer and the substrate layer.

4. The device of claim 1, wherein:
    at least one of the substrate layer and the function layer include silicon; and
    the sacrificial layer includes an oxide bearing material.

5. The device as recited in claim 4, wherein the substrate layer, the sacrificial layer, and the function layer collectively form an SOI wafer.

6. The device as recited in claim 4, wherein:
    the sacrificial layer is deposited on the substrate layer; and
    the function layer is deposited epitaxially on the sacrificial layer.

7. The device as recited in claim 1, further comprising:
    a further sacrificial layer on at least a third portion of the function layer; and
    a further encapsulation layer on at least a fourth portion of the further sacrificial layer;
    wherein the further sacrificial layer is released from the function layer by exposing the device to gaseous hydrogen.

* * * * *